(12) United States Patent
Poehnl et al.

(10) Patent No.: US 11,341,065 B2
(45) Date of Patent: May 24, 2022

(54) METHOD, COMPUTER PROGRAM, ELECTRONIC MEMORY MEDIUM, DEVICE FOR PROVIDING A DATUM

(71) Applicant: Robert Bosch GmbH, Stuttgart (DE)

(72) Inventors: Michael Poehnl, Wurmberg (DE); Christian Eltzschig, Berlin (DE); Dietrich Kroenke, Berlin (DE); Gerd Hirsch, Beilstein (DE); Mathias Kraus, Berlin (DE); Matthias Killat, Berlin (DE); Piotr Palka, Berlin (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/020,203

(22) Filed: Sep. 14, 2020

(65) Prior Publication Data

US 2021/0103532 A1 Apr. 8, 2021

(30) Foreign Application Priority Data

Oct. 4, 2019 (DE) .......................... 102019215296.1

(51) Int. Cl.
*G06F 13/16* (2006.01)
*G11C 7/10* (2006.01)

(52) U.S. Cl.
CPC ...... *G06F 13/1673* (2013.01); *G06F 13/1663* (2013.01); *G11C 7/1003* (2013.01); *G11C 7/1057* (2013.01); *G11C 7/1084* (2013.01)

(58) Field of Classification Search
None
See application file for complete search history.

(56) References Cited

U.S. PATENT DOCUMENTS 6,618,775 B1 * 9/2003 Davis .................. G06F 11/3466
710/100

* cited by examiner

*Primary Examiner* — James G Norman
(74) *Attorney, Agent, or Firm* — Norton Rose Fulbright US LLP; Gerard Messina

(57) ABSTRACT

A method for providing a datum in a receive buffer memory. The method includes storing the datum to be provided in the receive buffer memory, and retrieving an old datum from the receive buffer memory, if the receive buffer memory overflows as a result of storing the datum to be provided.

12 Claims, 3 Drawing Sheets

METHOD, COMPUTER PROGRAM, ELECTRONIC MEMORY MEDIUM, DEVICE FOR PROVIDING A DATUM

CROSS REFERENCE

The present application claims the benefit under 35 U.S.C. § 119 of German Patent Application No. DE 102019215296.1 filed on Oct. 4, 2019, which is expressly incorporated herein by reference in its entirety.

FIELD

The present invention provides a method, a computer program, an electronic memory medium as well as a device for providing a datum in a communication system.

BACKGROUND INFORMATION

Conventionally, data structures, such as queues, are used to transmit data in communication systems, in which transmitters (producers) transmit data to one or multiple receiver(s) (consumer(s)). A typical implementation of queues takes place according to the "first in—first out" (FIFO) principle or the "last in—first out" (LIFO) principle.

One central problem with such communication systems are limited hardware resources, for example in the form of the memory or receive buffer memory.

This may result in problems, if there is an imbalance between the amount of sent data (for example the number of data packages) and the amount of receivable or processable data. Such an imbalance may occur, for example, if the transmitter (producer) (continuously) sends data at a higher frequency than the one at which one of the receivers (consumer) processes the data. This is generally referred to as an overflow.

One strategy for dealing with an overflow situation is to discard the data that were sent last. One alternative strategy is to discard the oldest, not yet processed data in order to keep the data that were sent last.

The choice of the overflow strategy strongly depends on the boundary conditions of the communication system and the demands made of the communication system.

Furthermore, conventional resilient systems have the ability to not break down completely in the case of partial failure. To possess this ability, a redundant storage of the most up-to-date input data is necessary among other things, depending on the requirement.

One possible implementation of a resilient system includes an active part and a stand-by part that may compensate for the active part immediately following the breakdown of the active part.

It is possible to provide the input data via a queue for the purpose of redundantly providing the most up-to-date input data. In addition to the redundant storage of the input data, there is the problem of having to synchronize the input data.

For this reason, strategies are necessary as to how to deal with the limited resources.

SUMMARY

The present invention provides a method for providing a datum in a receive buffer memory.

The method includes a step of storing the datum in the receive buffer memory.

The method is characterized by a step of retrieving an old datum from the receive buffer memory, if the receive buffer memory overflows as a result of the received datum being stored.

In the present case, a receive buffer memory may be understood to mean a data structure that is configured to receive data to be provided from a transmitter (producer) and to provide those data to one or multiple receiver(s) (consumer(s)).

In the present case, "retrieving" is understood to mean that on the one hand, the memory space assumed in the receive buffer memory by the datum to be retrieved is freed for storing a new datum and that on the other hand, the storing transmitter receives the datum to the retrieved.

The freeing of the memory space as well as the receiving of the datum to be retrieved may take place in many different ways and strongly depends on the boundary conditions of the communication system in which the method is used.

The aspect that after the step of retrieving, the retrieved datum is in the management scope of the transmitter is of central meaning to this present invention.

The method has the advantage that by retrieving an old, not yet processed datum from the receive buffer memory, the transmitter is always able to store the most up-to-date datum in the receive buffer memory on the one hand and that on the other hand, the retrieved datum is not lost, but is in the management scope of the transmitter and therefore the transmitter may deal with the datum or with the present overflow situation depending on the demand made of the communication system. On the one hand, it is ensured in this way that the receiver(s) always has/have the most up-to-date datum available for processing and that on the other hand, the transmitter and thus the communication system may respond flexibly to an overflow situation. This advantageously increases the flexibility of the communication system.

According to one specific embodiment of the method of the present invention, the old datum is the oldest datum in the receive buffer memory.

According to a further specific embodiment of the method of the present invention, the receive buffer memory is a part of a shared memory means.

A shared memory means (i.e., shared memory device) is in the present case understood to mean a memory means (i.e., memory device) or a portion of a memory means (i.e., memory device) that may be accessed by several users (for example of a communication system), for example by one or multiple transmitter(s) (producer(s)) and by one or multiple receiver(s) (consumer(s)) in a writing or reading manner. In communication systems having up-to-date processes, in particular, accesses to the shared memory means must be managed in such a way that inconsistent storage states do not occur.

The advantage of using a shared memory means is that a datum may be provided according to a so-called "zero-copy" approach. This means that the datum to be sent for the purpose of transmitting a datum from a transmitter to a receiver does not have to be copied.

This may be achieved, for example, in that the transmitter (producer) first pulls (allocates) the shared memory means into its management scope and puts the datum to be transmitted into the shared memory means. The transmitter subsequently releases the allocated portion and the receiver (consumer) pulls the shared memory means into its management scope in order to process the datum stored therein.

According to one specific embodiment of the method of the present invention, the receive buffer memory is designed as a ring memory.

A ring memory, in the present case, is understood to mean a memory structure that is configured in such a way that the memory is capable of constantly receiving a new datum. In the case that the capacity of the ring memory is exhausted, an old datum, typically the oldest datum stored in the ring memory, is overwritten by a new datum when the new datum is received.

A further aspect of the present invention is a computer program that is configured to carry out all steps of the method according to the present invention.

A further aspect of the present invention is an electronic memory medium, on which the computer program according to the present invention is stored.

A further aspect of the present invention is a device that is configured to carry out all steps of the method according to the present invention.

Specific embodiments of the present invention are elucidated in below based on the figures.

DETAILED DESCRIPTION OF EXAMPLE EMBODIMENTS

Figure 1:
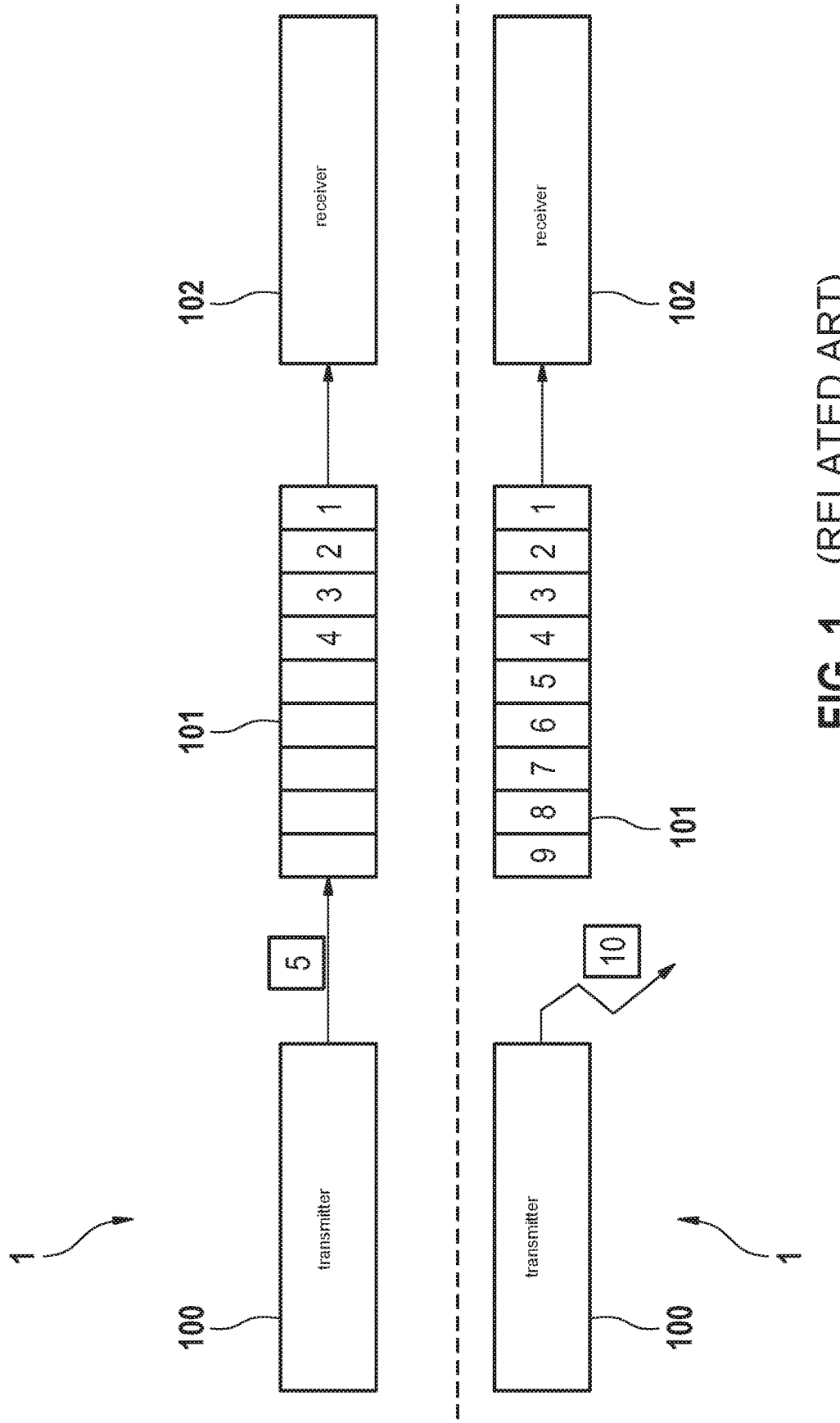
FIG. 1 shows a schematic illustration of a communication system including a receive buffer memory, which is implemented as a FIFO, according to the related art.

FIG. 1 shows a schematic illustration of a communication system 1 including a receive buffer memory 101, which is implemented as a FIFO, according to the related art.

Communication system 1 includes a transmitter 100, a receive buffer memory 101, and a receiver 102. Transmitter 100 may be a sensor, for example. A surroundings sensor of a vehicle operated in an at least semi-automated manner would be conceivable. Receive buffer memory 101 is implemented according to a first in—first out (FIFO) queue in the present case. Receiver 102 may be an application, for example. A method for operating a vehicle operated in an at least semi-automated manner would be conceivable.

In the upper part of FIG. 1, communication system 1 is illustrated in a situation, in which receive buffer memory 101 is already filled with data 1, 2, 3, 4 and still has available memory space for receiving most up-to-date datum 5. This means that receive buffer memory 101 is not filled completely in the illustrated situation. Storing up-to-date datum 5 does not result in receive buffer memory 101 overflowing.

In the lower part of FIG. 1, communication system 1 is illustrated in a situation, in which receive buffer memory 101 is already filled with data 1, 2, 3, 4, 5, 6, 7, 8, 9 and no longer has available memory space for receiving most up-to-date datum 10. This means that receive buffer memory 101 is filled completely in the illustrated situation. Storing up-to-date datum 10 results in receive buffer memory overflowing. There is therefore an overflow situation.

According to the related art, there are different strategies to deal with an overflow situation. In the illustrated case, transmitter 100 discards most up-to-date datum 10. This means that receiver 102 will never be able to process most up-to-date datum 10, since this datum 10 is lost.

In a not illustrated strategy, it may be provided that transmitter 100 is blocked from sending further data until receiver 102 has retrieved sufficient data 1, 2, 3, 4, 5, 6, 7, 8, 9 from receive buffer memory 101, so that most up-to-date datum 10 may be stored in the receive buffer memory. This strategy has the disadvantage that transmitter 100 is blocked for the waiting period until receive buffer memory 101 has sufficient memory space. This has an effect on communication system 1.

In a further not illustrated strategy, it may be provided that receive buffer memory 101 discards an old, not yet processed datum 1, 2, 3, 4, 5, 6, 7, 8, 9, preferably the oldest, not yet processed datum 1, and thus creates memory space for receiving most up-to-date datum 10. This strategy has the disadvantage that receiver 102 is not able to process all data, in particular discarded datum 1. Since receive buffer memory 101 discards datum 1, it cannot be processed at a different location either, for example by another, not illustrated receiver having sufficient resources.

Furthermore, this strategy requires a management process for receive buffer memory 101, which is independent from transmitter 100 and receiver 102. In communication systems 1, in which receive buffer memory 101 is implemented with the aid of a shared memory means, it is not ensured that an independent management process is present for managing receive buffer memory 101.

Figure 2:
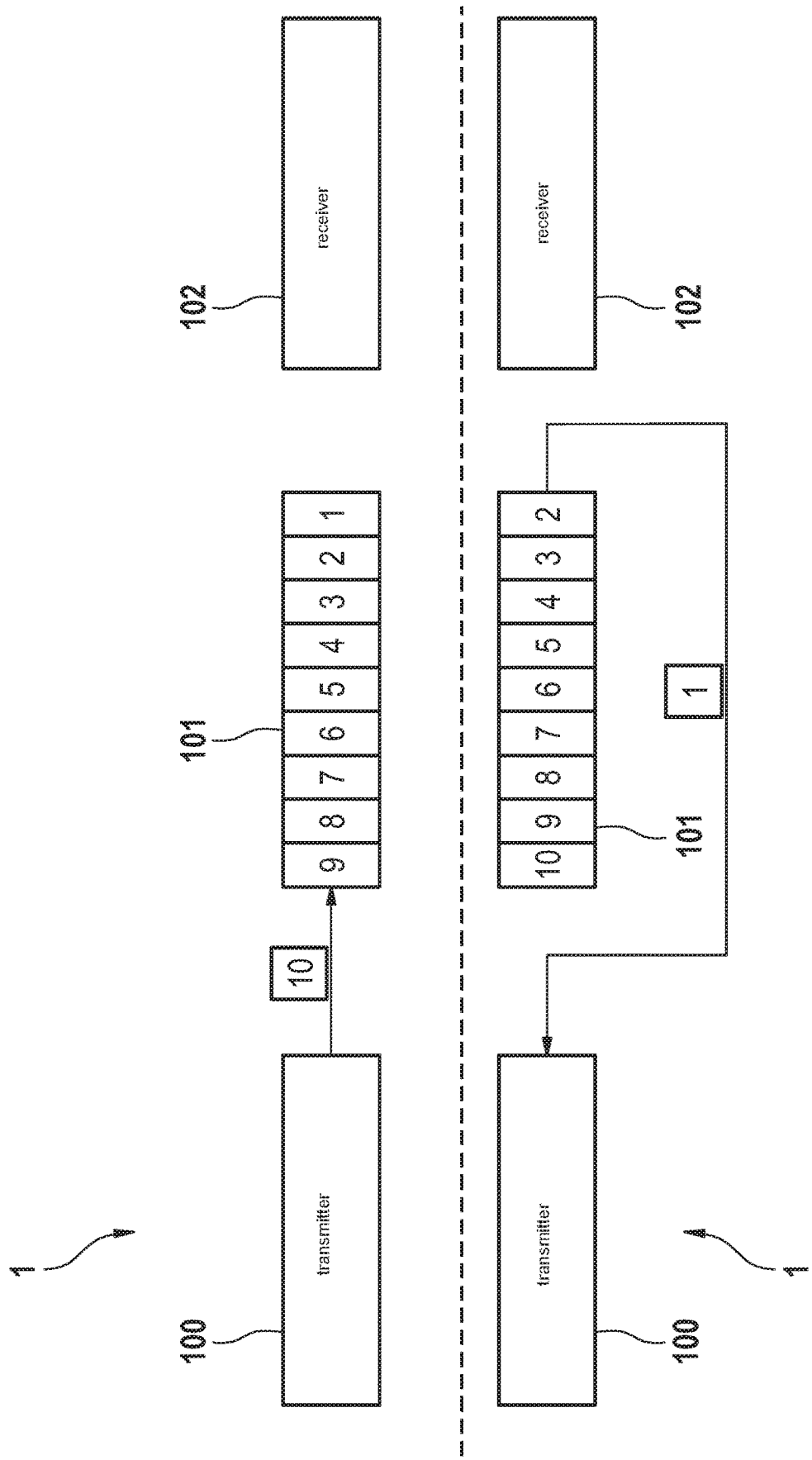
FIG. 2 shows a schematic illustration of a communication system including a receive buffer memory, which is implemented as a FIFO, according to the present invention.

FIG. 2 shows a schematic illustration of a communication system 1 including a receive buffer memory 101, which is implemented as a FIFO, according to the present invention.

Communication system 1 includes a transmitter 100, a receive buffer memory 101, and a receiver 102. Transmitter 100 may be a sensor, for example. A surroundings sensor of a vehicle operated in an at least semi-automated manner would be conceivable. Receive buffer memory 101 is implemented according to a first in—first out (FIFO) queue in the present case. Receiver 102 may be an application, for example. A method for operating a vehicle operated in an at least semi-automated manner would be conceivable.

In the upper part of FIG. 2, communication system 1 is illustrated in a situation, in which receive buffer memory 101 is already filled with data 1, 2, 3, 4, 5, 6, 7, 8, 9 and no longer has available memory space for receiving most up-to-date datum 10. This means that receive buffer memory 101 is filled completely in the illustrated situation. Storing up-to-date datum 10 results in receive buffer memory overflowing. There is therefore an overflow situation.

The characteristic aspect of the present invention is illustrated in the lower part of FIG. 2: If an overflow situation occurs, an old, not yet processed datum 1, 2, 3, 4, 5, 6, 7, 8, 9, in the present case oldest, not yet processed datum 1, is retrieved from receive buffer memory 101 and supplied to the transmitter in the illustrated case.

With the aid of this step, a memory space is created in receive buffer memory 101 for storing up-to-date datum 10 on the one hand, and transmitter 100 is supplied with retrieved datum 1, on the other hand. Now, transmitter 100 is able to respond to this overflow situation flexibly and according to the requirements made of communication system 1.

Possible responses may involve, among other things, actively discarding supplied datum 1, resending datum 1, adapting the storage capacity for receive buffer memory 101, delivering supplied datum 1 to a receive buffer memory of a different, not illustrated receiver or also adapting the frequency of sender 100.

It is overall possible to respond very flexibly to an overflow situation. The flexibility of a communication system 1, in which the method or an aspect of the present invention is employed, is thus increased.

Figure 3:
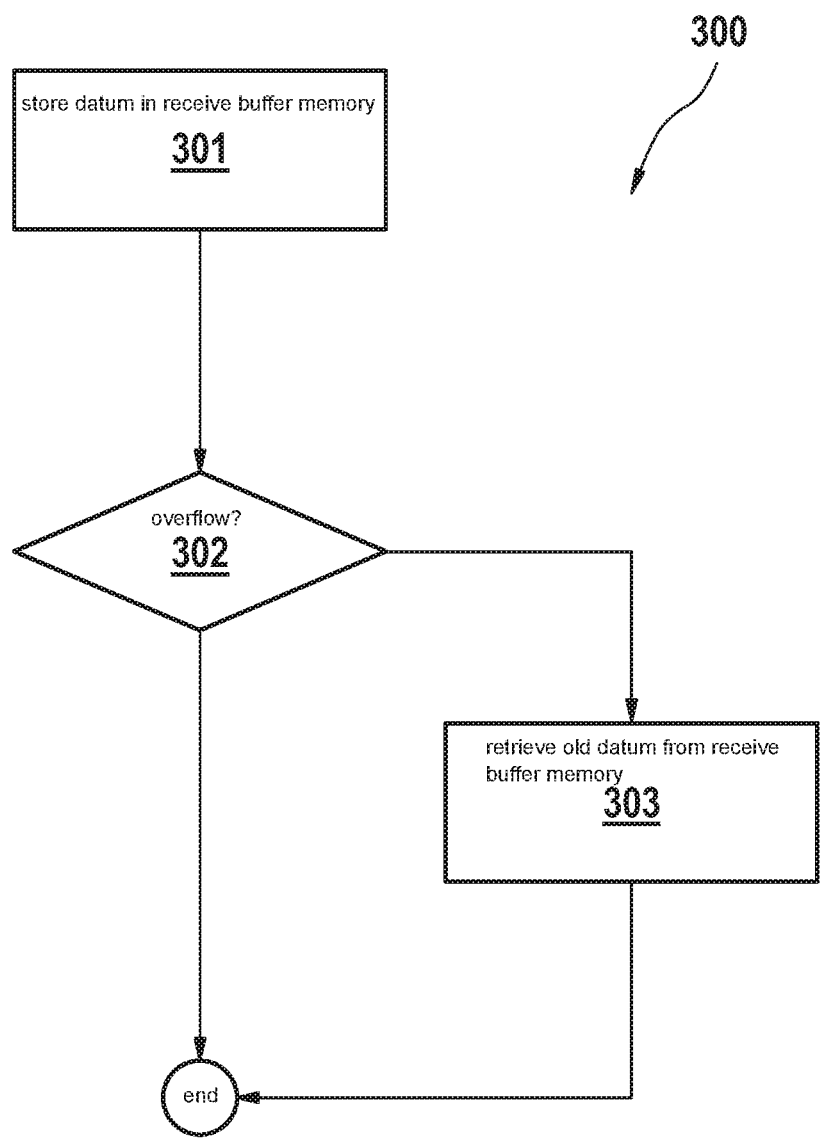
FIG. 3 schematically shows a flow chart of one specific embodiment of the method according to the present invention.

FIG. 3 schematically shows a flow chart of one specific embodiment of method 300 according to the present invention.

In step 301, a datum 10, which is provided by a transmitter 100, is stored in a receive buffer memory 101 of a communication system 1.

In step 302, it is checked or detected, whether an overflow situation occurs as a result of storing 301 datum 10 in receive buffer memory 101, in other words, whether receive buffer memory 101 overflows as a result of storing datum 10 to be provided.

If such a situation does not occur, method 300 is terminated. Otherwise, the method is continued in step 303.

In step 303, a not yet processed datum 1, 2, 3, 4, 5, 6, 7, 8, 9, in other words an old datum 1, 2, 3, 4, 5, 6, 7, 8, 9, is retrieved from receive buffer memory 101.

What is claimed is:

1. A method for providing data from a transmitter for processing by a first receiver via a receive buffer memory that includes a plurality of memory cells, comprising:
   the transmitter storing in the receive buffer memory a first subset of the data, each datum of the first subset of the data occupying a respective one of the plurality of memory cells so that the respective cell is in an occupied state, the respective cell being subsequently releasable from the occupied state by a reading by the first receiver of the respective datum in the respective cell;
   the transmitter making a further datum of the data available for the receive buffer memory;
   determining that all of the cells of the receive buffer memory are in the occupied state while the further datum of the data is available, so that the further datum is therefore not writable to the receive buffer memory; and
   in response to the determination, the transmitter retrieving at least one datum of the first subset of the data from the receive buffer memory without a reading of the one old datum by the first receiver, thereby releasing from the occupied state the memory cell of the receive buffer memory in which the retrieved at least one datum was previously stored.

2. The method as recited in claim 1, wherein the at least one datum is an oldest datum in the receive buffer memory.

3. The method as recited in claim 1, wherein the receive buffer memory is a part of a shared memory.

4. The method as recited in claim 1, wherein the receive buffer memory is a ring memory.

5. The method as recited in claim 1, further comprising:
   subsequent to the retrieving of the at least one datum of the first subset of the data from the receive buffer memory, the transmitter storing the retrieved at least one datum again in the receive buffer memory.

6. The method as recited in claim 1, further comprising:
   in response to the determination, modifying a storage capacity of the receive buffer memory.

7. The method as recited in claim 1, further comprising:
   subsequent to the retrieving of the at least one datum of the first subset of the data from the receive buffer memory, the transmitter providing the retrieved at least one datum towards a second receiver for processing of the retrieved at least one datum by the second receiver instead of the first receiver.

8. The method as recited in claim 1, further comprising:
   in response to the determination, modifying a frequency of the transmitter.

9. The method as recited in claim 1, further comprising:
   responsive to the retrieving of the at least one datum of the first subset of the data from the receive buffer memory, storing the further datum in the receive buffer memory.

10. The method as recited in claim 1, further comprising:
    the receiver reading at least one datum of the first subset of the data, thereby releasing at least one of the memory cells from the occupied state, wherein, subsequent to the reading and prior to the transmitter making the further datum of the data available for the receive buffer memory, at least one further datum of the first subset of the data is stored by the transmitter in the released at least one of the memory cells.

11. A non-transitory electronic memory medium on which is stored a computer program for providing data from a transmitter for processing by a first receiver via a receive buffer memory that includes a plurality of memory cells, the computer program, when executed by a computer of the transmitter, causing the computer to perform a method comprising:
    the transmitter storing in the receive buffer memory a first subset of the data, each datum of the first subset of the data occupying a respective one of the plurality of memory cells so that the respective cell is in an occupied state, the respective cell being subsequently releasable from the occupied state by a reading by the first receiver of the respective datum in the respective cell;
    the transmitter making a further datum of the data available for the receive buffer memory; and
    in response to a determination that all of the cells of the receive buffer memory are in the occupied state while the further datum of the data is available, so that the further datum is therefore not writable to the receive buffer memory, the transmitter retrieving at least one datum of the first subset of the data from the receive buffer memory without a reading of the one old datum by the first receiver, thereby releasing from the occupied state the memory cell of the receive buffer memory in which the retrieved at least one datum was previously stored.

12. A device comprising:
    a transmitter;
    a first receiver; and
    a receive buffer memory that includes a plurality of memory cells;
    wherein the device is configured to provide data from the transmitter for processing by the first receiver via the receive buffer memory by performing a method that includes:
       the transmitter storing in the receive buffer memory a first subset of the data, each datum of the first subset of the data occupying a respective one of the plurality of memory cells so that the respective cell is in an occupied state, the respective cell being subsequently releasable from the occupied state by a reading by the first receiver of the respective datum in the respective cell;
       the transmitter making a further datum of the data available for the receive buffer memory;
       determining that all of the cells of the receive buffer memory are in the occupied state while the further datum of the data is available, so that the further datum is therefore not writable to the receive buffer memory; and in response to the determination, the transmitter retrieving at least one datum of the first subset of the data from the receive buffer memory without a reading of the one old datum by the first receiver, thereby releasing from the occupied state the memory cell of the receive buffer memory in which the retrieved at least one datum was previously stored.

\* \* \* \* \*